United States Patent
Li et al.

(10) Patent No.: US 11,282,469 B2
(45) Date of Patent: Mar. 22, 2022

(54) SHIFT REGISTER UNIT AND METHOD FOR DRIVING THE SAME, GATE DRIVING CIRCUIT AND DISPLAY APPARATUS

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Yunze Li, Beijing (CN); Ni Yang, Beijing (CN); Qi Hu, Beijing (CN); Jianfeng Liu, Beijing (CN); Zhi Wang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 22 days.

(21) Appl. No.: 16/640,726

(22) PCT Filed: Sep. 23, 2019

(86) PCT No.: PCT/CN2019/107344
§ 371 (c)(1),
(2) Date: Feb. 20, 2020

(87) PCT Pub. No.: WO2020/082956
PCT Pub. Date: Apr. 30, 2020

(65) Prior Publication Data
US 2021/0142752 A1    May 13, 2021

(30) Foreign Application Priority Data
Oct. 25, 2018 (CN) .......................... 201811255897.7

(51) Int. Cl.
*G09G 3/36* (2006.01)
*G11C 19/28* (2006.01)

(52) U.S. Cl.
CPC ......... *G09G 3/3674* (2013.01); *G09G 3/3648* (2013.01); *G11C 19/28* (2013.01);
(Continued)

(58) Field of Classification Search
CPC .............. G09G 3/3674; G09G 3/3648; G09G 2300/0426; G09G 2310/0286; G09G 2310/08; G09G 3/36; G11C 19/28
See application file for complete search history.

(56) References Cited

U.S. PATENT DOCUMENTS

2014/0133621 A1* 5/2014 Shang .................. G11C 19/184
377/67
2016/0268004 A1* 9/2016 Li ........................ G09G 3/3648
(Continued)

*Primary Examiner* — Jeff Piziali
(74) *Attorney, Agent, or Firm* — Kinney & Lange, P.A.

(57) ABSTRACT

The embodiments of the present disclosure disclose a shift register unit and a method for driving the same, a gate driving circuit, and a display apparatus. The shift register unit includes: an input circuit configured to output an input signal from an input signal terminal to a pull-up node; an output circuit configured to output a clock signal from a clock signal terminal to an output signal terminal under control of a potential at the pull-up node; a resetting and de-noising circuit configured to reset and de-noise the pull-up node and the output signal terminal under control of a potential at a pull-down node; and a pull-down node control circuit coupled to a first voltage terminal and the pull-down node, and configured to electrically couple the pull-down node to the first voltage terminal under control of the potential at the pull-down node.

18 Claims, 11 Drawing Sheets

(52) U.S. Cl.
CPC ............... *G09G 2300/0426* (2013.01); *G09G 2310/0286* (2013.01); *G09G 2310/08* (2013.01)

(56) References Cited

U.S. PATENT DOCUMENTS

| | | | |
|---|---|---|---|
| 2016/0365054 A1* | 12/2016 | Wu | G09G 3/3677 |
| 2017/0061913 A1* | 3/2017 | Wang | G11C 19/184 |
| 2017/0213515 A1* | 7/2017 | Chen | G11C 19/28 |
| 2017/0221441 A1* | 8/2017 | Gu | G09G 3/3677 |

\* cited by examiner

SHIFT REGISTER UNIT AND METHOD FOR DRIVING THE SAME, GATE DRIVING CIRCUIT AND DISPLAY APPARATUS

CROSS-REFERENCE TO RELATED APPLICATION(S)

This application is the national phase of PCT Application No. PCT/CN2019/107344 filed on Sep. 23, 2019, which in turn claims priority to the Chinese Patent Application No. 201811255897.7, filed on Oct. 25, 2018, which is incorporated herein by reference in its entirety.

TECHNICAL FIELD

The present disclosure relates to the field of display, and particularly to a shift register unit and a method for driving the same, a gate driving circuit, and a display apparatus.

BACKGROUND

In a Thin Film Transistor (TFT)-based Liquid Crystal Device (LCD), a gate driving circuit for driving gates may be formed on a display panel to form a Gate drive On Array (GOA) panel. The gate driving circuit may comprise a plurality of cascaded shift register units. In a conventional gate driving circuit, an output signal of a next stage of shift register unit is usually used as a reset signal of a current stage of shift register unit, and an output signal of a previous stage of shift register unit is usually used as an input signal of the current stage of shift register unit.

However, especially in a case where the display panel has a large area, an output signal of a shift register unit may have a waveform distortion.

SUMMARY

Embodiments of the present disclosure provide a shift register unit and a method for driving the same, a gate driving circuit, and a display apparatus.

According to an aspect of the embodiments of the present disclosure, there is provided a shift register unit, comprising:

an input circuit coupled to an input signal terminal and a pull-up node, and configured to output an input signal from the input signal terminal to the pull-up node;

an output circuit coupled to a clock signal terminal, an output signal terminal and the pull-up node, and configured to output a clock signal from the clock signal terminal to the output signal terminal under control of a potential at the pull-up node;

a resetting and de-noising circuit coupled to the pull-up node, a pull-down node and the output signal terminal, and configured to reset and de-noise the pull-up node and the output signal terminal under control of a potential at the pull-down node; and a pull-down node control circuit coupled to a first voltage terminal and the pull-down node, and configured to electrically couple the pull-down node to the first voltage terminal under control of the potential at the pull-down node.

In an example, the pull-down node control circuit is further coupled to the pull-up node and a second voltage terminal, and is further configured to control electrical coupling between the first voltage terminal and the second voltage terminal under control of the potential at the pull-up node.

In an example, the pull-down node control circuit comprises a first transistor, a second transistor and a third transistor, wherein the first transistor has a gate coupled to the pull-down node, a first electrode coupled to the first voltage terminal, and a second electrode coupled to a first electrode and a gate of the second transistor;

the second transistor has a second electrode coupled to a gate of the third transistor; and the third transistor has a first electrode coupled to the second electrode of the first transistor, and a second electrode coupled to the pull-down node.

In an example, the pull-down node control circuit further comprises a fourth transistor, wherein the fourth transistor has a gate coupled to the pull-up node, a first electrode coupled to the second voltage terminal, and a second electrode coupled to the gate of the first transistor.

In an example, the shift register unit further comprises a pull-down control trigger circuit coupled to a first trigger signal terminal and the pull-down node, and configured to provide a first trigger signal from the first trigger signal terminal to the pull-down node under control of the first trigger signal.

In an example, the pull-down control trigger circuit comprises a fifth transistor having a gate and a first electrode coupled to the first trigger signal terminal, and a second electrode coupled to the pull-down node.

In an example, the pull-down control trigger circuit is further coupled to a second trigger signal terminal, and is further configured to trigger the pull-down node control circuit to control the potential at the pull-down node under control of a second trigger signal from the second trigger signal terminal.

In an example, the pull-down control trigger circuit further comprises a sixth transistor having a gate and a first electrode coupled to the second trigger signal terminal, and a second electrode coupled to the pull-down node.

In an example, the pull-down node control circuit further comprises a seventh transistor having a gate coupled to the pull-up node, a first electrode coupled to the second voltage terminal, and a second electrode coupled to the gate of the third transistor.

In an example, the resetting and de-noising circuit comprises an eighth transistor and a ninth transistor, wherein the eighth transistor has a gate coupled to the pull-down node, a first electrode coupled to the second voltage terminal, and a second electrode coupled to the output signal terminal; and the ninth transistor has a gate coupled to the pull-down node, a first electrode coupled to the second voltage terminal, and a second electrode coupled to the pull-up node.

In an example, the input circuit comprises a tenth transistor having a gate and a first electrode coupled to the input signal terminal, and a second electrode coupled to the pull-up node.

In an example, the output circuit comprises an eleventh transistor and a capacitor, wherein a gate of the eleventh transistor and a first terminal of the capacitor are coupled to the pull-up node, a first electrode of the eleventh transistor is coupled to the clock signal terminal, and a second electrode of the eleventh transistor and a second terminal of the capacitor are coupled to the output signal terminal.

In an example, the shift register unit further comprises: a reset circuit coupled to the first trigger signal terminal, the pull-up node, the output signal terminal, and a second voltage terminal, and configured to reset the pull-up node and the output signal terminal to a potential at the second voltage terminal under control of the first trigger signal at the first trigger signal terminal.

In an example, the reset circuit comprises a twelfth transistor and a thirteenth transistor, wherein the twelfth transistor has a gate coupled to the first trigger signal terminal, a first electrode coupled to the second voltage terminal, and a second electrode coupled to the pull-up node; and the thirteenth transistor has a gate coupled to the first trigger signal terminal, a first electrode coupled to the second voltage terminal, and a second electrode coupled to the output signal terminal.

According to another aspect of the embodiments of the present disclosure, there is provided a gate driving circuit, comprising:

N stages of cascaded shift register units described above, wherein an output signal terminal of an $n^{th}$ stage of shift register unit is coupled to an input signal terminal of an $(n+1)^{th}$ stage of shift register unit, and a first trigger signal terminal of the $n^{th}$ stage of shift register unit is coupled to an output signal terminal of the $(n+1)^{th}$ stage of shift register unit, where N is an integer greater than or equal to 2, and n is an integer greater than or equal to 1 and less than (N−1).

In an example, each of the N stages of cascaded shift register units has a second trigger signal terminal coupled to receive a frame reset signal.

According to yet another aspect of the embodiments of the present disclosure, there is provided a method of driving the shift register unit described above, comprising:

in a first period in which an input signal is at a first level, raising, by the input circuit, a potential at the pull-up node;

in a second period in which a clock signal is at the first level, continuously raising the potential at the pull-up node, and causing, by the output circuit, the output signal terminal to be at the first level; and in a third period, electrically coupling, by the pull-down node control circuit, the first voltage terminal to the pull-down node under control of a potential at the pull-down node, and resetting and de-noising, by the resetting and de-noising circuit, the pull-up node and the output signal terminal In an example, the pull-down node control circuit is further coupled to the pull-up node and a second voltage terminal, and in the first period and the second period, the pull-down node control circuit electrically decouples the first voltage terminal from the second voltage terminal under control of the potential at the pull-up node.

In an example, the shift register unit further comprises a pull-down control trigger circuit, and the method further comprises: in the third period in which the first trigger signal is at the first level, triggering, by the pull-down control trigger circuit, the pull-down node control circuit to control the potential at the pull-down node under control of the first trigger signal.

In an example, the method further comprises: in a fourth period, continuously de-noising, by the resetting and de-noising circuit, the pull-up node and the output signal terminal under control of the potential at the pull-down node.

BRIEF DESCRIPTION OF THE ACCOMPANYING DRAWINGS

DETAILED DESCRIPTION

Figure 1:
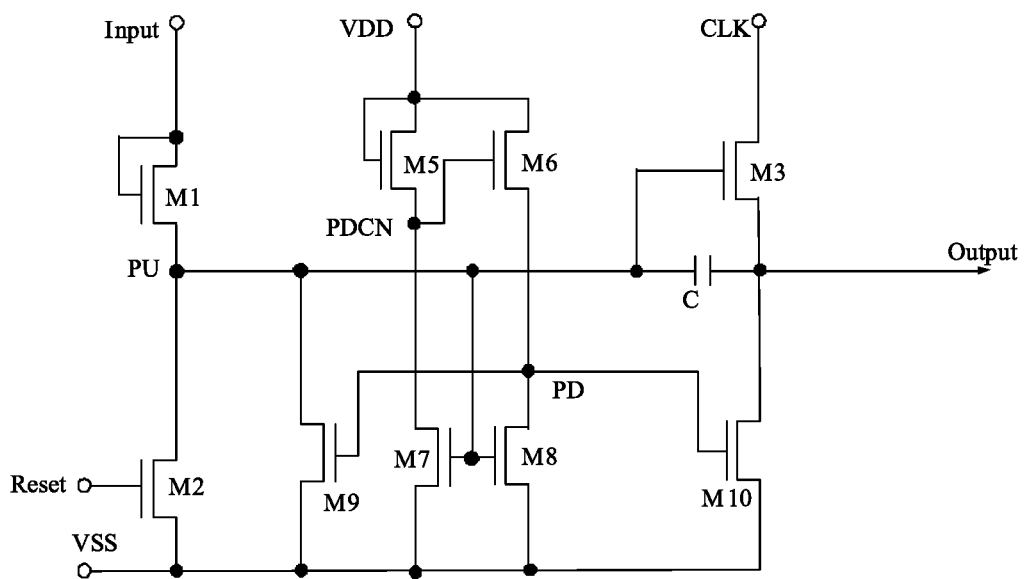
FIG. 1 illustrates an exemplary circuit diagram of a shift register unit.

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. Obviously, the embodiments described are a part of the embodiments of the present disclosure instead of all the embodiments. All other embodiments obtained by those of ordinary skill in the art based on the described embodiments of the present disclosure without contributing any creative work are within the protection scope of the present disclosure. It should be illustrated that throughout the accompanying drawings, the same elements are represented by the same or similar reference signs. In the following description, some specific embodiments are for illustrative purposes only and are not to be construed as limiting the present disclosure, but merely examples of the embodiments of the present disclosure. The conventional structure or construction will be omitted when it may cause confusion with the understanding of the present disclosure. It should be illustrated that shapes and dimensions of components in the figures do not reflect true sizes and proportions, but only illustrate contents of the embodiments of the present disclosure.

Unless otherwise defined, technical terms or scientific terms used in the embodiments of the present disclosure should be of ordinary meanings to those skilled in the art. "First", "second" and similar words used in the embodiments of the present disclosure do not represent any order, quantity or importance, but are merely used to distinguish between different constituent parts.

Furthermore, in the description of the embodiments of the present disclosure, the term "coupled with" or "coupled to" may mean that two components are directly coupled, or that two components are coupled via one or more other components. In addition, the two components may be connected or coupled by wire or wirelessly.

In addition, in the description of the embodiments of the present disclosure, terms "first level" and "second level" are only used to distinguish magnitudes of the two levels from each other. For example, description is made below by taking the "first level" being a high level and the "second level" being a low level as an example. It may be understood by those skilled in the art that the present disclosure is not limited thereto.

The switch transistors used in the embodiments of the present disclosure may each be a thin film transistor or a field effect transistor or other devices having the same characteristics. The thin film transistors used in the embodiments of the present disclosure may be oxide semiconductor transistors. Since a source and a drain of the thin film transistor used herein are symmetrical, the source and the drain thereof may be interchanged. In the embodiments of the present disclosure, one of the source and the drain is referred to as a first electrode, and the other of the source and the drain is referred to as a second electrode. In the following example, N-type thin film transistors are taken as an example for description. It may be understood by those skilled in the art that the embodiments of the present disclosure may obviously be applied to a case of P-type thin film transistors.

Figure 2:
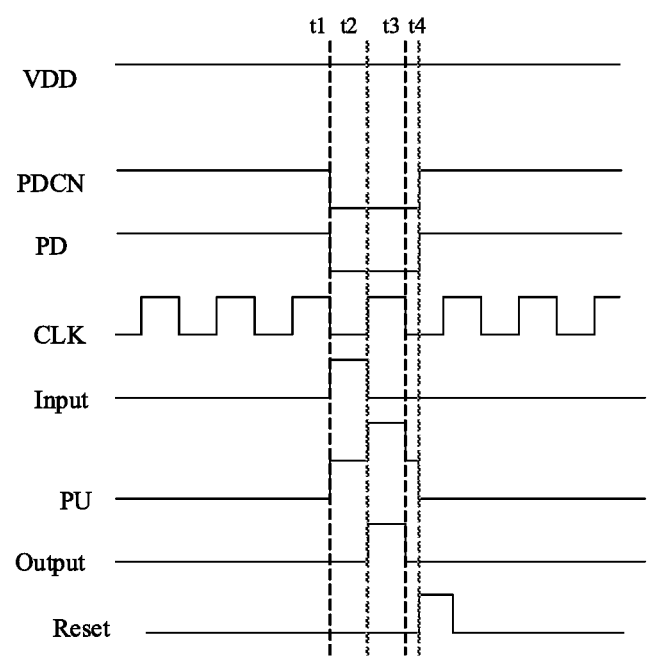
FIG. 2 illustrates an operation timing diagram of the shift register unit in FIG. 1.

FIG. 1 illustrates an exemplary circuit diagram of an exemplary shift register unit, and FIG. 2 illustrates an operation timing diagram of the shift register unit in FIG. 1. Next, an operation of the shift register unit in FIG. 1 will be described with reference to FIGS. 1 and 2.

As shown in FIG. 1, description is made by taking all switch transistors being NMOS transistors as an example. In the circuit structure shown in FIG. 1, description is made by taking a power signal terminal VDD being at a high level and a reference signal at a reference signal terminal VSS being a low level signal as an example.

As shown in FIG. 2, in a period t1, a reset signal at a reset signal terminal Reset and an input signal at a signal input terminal Input are both at a low level, and a power signal at the power signal terminal VDD is at a high level. At this time, a transistor M5 is turned on, and the power signal VDD is transmitted to a node PDCN, so that a transistor M6 is turned on. The transistor M6 is turned on so that a pull-down node PD is at a high level, to cause a transistor M9 and a transistor M10 to be turned on, and thereby a reference voltage signal VSS at a low level is transmitted to a pull-up node PU and a signal output terminal Output through the transistor M9 and the transistor M10 respectively, to continuously de-noise the pull-up node PU and the signal output terminal Output, that is, a signal at the pull-up node PU and an output signal at the signal output terminal Output are both at a low level.

In a period t2, the input signal at the signal input terminal Input is at a high level, a transistor M1 is turned on, and a voltage at the pull-up node PU starts to raise to charge a capacitor C. Since the pull-up node PU is at a high level, a transistor M7 and a transistor M8 are turned on, and the reference voltage signal VSS is transmitted to the node PDCN and the pull-down node PD through the transistor M7 and the transistor M8 respectively. At the same time, since the pull-up node PU is at a high level, a transistor M3 is turned on, to transmit a clock signal at a clock signal terminal CLK to the signal output terminal Output. Since the clock signal is at a low level at this time, the output signal at the signal output terminal Output is also at a low level.

In a period t3, the clock signal at the clock signal terminal CLK is at a high level, the transistor M3 is continuously turned on under action of the pull-up node PU, to transmit the clock signal to the signal output terminal Output. At this time, the output signal at the signal output terminal Output is at a high level. Due to the bootstrapping effect of the storage capacitor C, the high level at the signal output terminal Output causes the potential at the pull-up node PU to be bootstrapped to a higher potential. The high potential at the pull-up node PU causes the transistor M7 and the transistor M8 to be continuously turned on, and thereby the reference voltage signal VSS is continuously transmitted to the node PDCN and the pull-down node PD through the transistor M7 and the transistor M8 respectively.

In a period t4, the clock signal at the clock signal terminal CLK is at a low level, and at this time, the output signal at the signal output terminal Output is a low level signal. The level at the pull-up node PU starts to fall, but since the clock signal is at a low level, the potential at the pull-up node PU is still a relatively high level which may cause a transistor to be turned on through the bootstrapping effect of the storage capacitor C.

It may be known from the above that in the shift register unit shown in FIG. 1, in the period t1, the power signal VDD is used to continuously de-noise the pull-up node PU and the signal output terminal Output. In the period t2, the period t3, and the period t4, the output signal at the signal output terminal Output is determined by the clock signal at the clock signal terminal CLK to ensure normal output of the shift register unit.

In the operation of the above shift register unit, the potential at the pull-up node PU and the potential at the pull-down node PD are mutually restricted and competed. In the period t2 and the period t3, if the pull-up node PU is charged too slowly, the potential at the pull-down node PD may not be pulled down in time, or if the potential at the pull-down node PD decreases too slowly, it may affect the raising of the potential at the pull-up node PU, thereby resulting in poor output of a GOA which may be more serious due to the increase in the number of stages of the shift registers in the gate driving circuit. In addition, in the period t3, the potential at the pull-up node PU is maintained at a high level. In FIG. 1, the power signal terminal VDD which provides a de-noising direct current signal at a high level is coupled with the reference signal terminal VSS which provides a direct current signal VSS at a low level, generating additional power consumption.

Figure 3A:
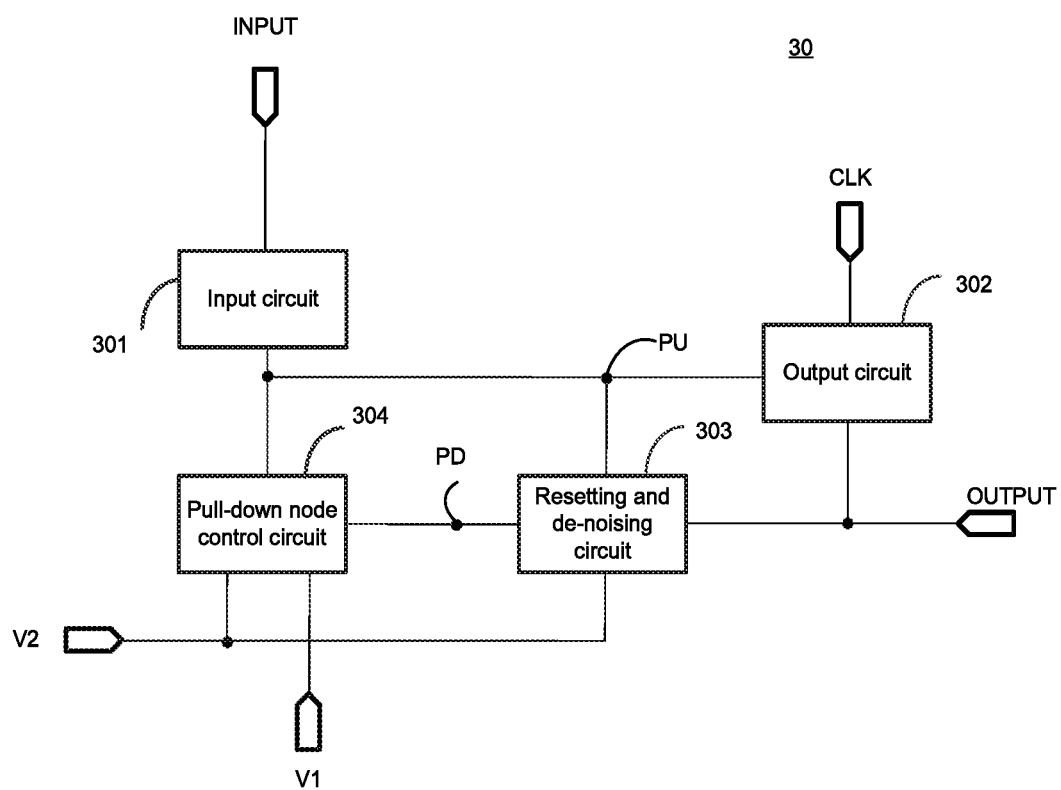
FIG. 3A illustrates a schematic block diagram of a shift register unit according to an embodiment of the present disclosure.

The embodiments of the present disclosure provide a shift register unit. FIG. 3A illustrates a schematic block diagram of a shift register unit 30 according to an embodiment of the present disclosure. As shown in FIG. 3A, the shift register unit 30 according to the embodiment of the present disclosure may comprise an input circuit 301. The input circuit 301 is coupled to an input signal terminal INPUT and a pull-up node PU of the shift register unit 30. The input circuit 301 is configured to output an input signal Input from the input signal terminal INPUT to the pull-up node PU.

The shift register unit 30 may further comprise an output circuit 302. The output circuit 302 is coupled to a clock signal terminal CLK, an output signal terminal OUTPUT, and the pull-up node PU. The output circuit 302 is configured to output a clock signal Clk from the clock signal terminal CLK to the output signal terminal OUTPUT under control of a potential at the pull-up node PU.

The shift register unit 30 may further comprise a resetting and de-noising circuit 303. The resetting and de-noising circuit 303 is coupled to a pull-down node PD, the pull-up node PU, and the output signal terminal OUTPUT. The resetting and de-noising circuit 303 is configured to reset and de-noise the pull-up node PU and the output signal terminal OUTPUT under control of a potential at the pull-down node PD. For example, the resetting and de-noising circuit 303 is configured to be coupled to a second voltage terminal V2, so that when the potential at the pull-down node PD is at a high level, the pull-up node PU and the output signal terminal OUTPUT are electrically coupled to the second voltage terminal V2 at which a low level signal is input, and thereby the pull-up node PU and the output signal terminal OUTPUT may be reset and de-noised. For example, the second voltage terminal V2 may be configured to maintain a direct current low level signal to be input, which is the same in the description of the following examples, and will not be described in detail again.

The shift register unit 30 may further comprise a pull-down node control circuit 304. The pull-down node control circuit 304 is coupled to a first voltage terminal V1 and the pull-down node PD. The pull-down node control circuit 304 is configured to electrically couple the pull-down node PD to the first voltage terminal V1 under control of the potential at the pull-down node PD. For example, the first voltage terminal V1 may be configured to maintain a direct current high level signal to be input, which is the same in the description of the following examples, and will not be described in detail again.

According to the shift register unit according to the embodiment of the present disclosure, the potential at the pull-down node PD may be controlled by the pull-down node control circuit 304, so that when the potential at the pull-down node PD is, for example, at a high level, the pull-down node PD is electrically coupled to the first voltage terminal V1 at a high level, and thereby the pull-down node PD may be maintained at a high potential in, for example, a resetting period and a de-noising period of the shift register unit by using a positive feedback.

As shown in FIG. 3A, the pull-down node control circuit 304 is further coupled to the pull-up node PU and the second voltage terminal V2. The pull-down node control circuit 304 is further configured to control an electrical path between the first voltage terminal V1 and the second voltage terminal V2 under control of the potential at the pull-up node PU. For example, the pull-down node control circuit 304 is configured to electrically decouple the first voltage terminal V1 from the second voltage terminal V2 when the potential at the pull-up node PU is at a high level. Therefore, additional power consumption due to the electrical coupling between, for example, the first voltage terminal V1 which provides the direct current high level signal and, for example, the second voltage terminal V2 which provides the direct current low level signal may be reduced.

Figure 3B:
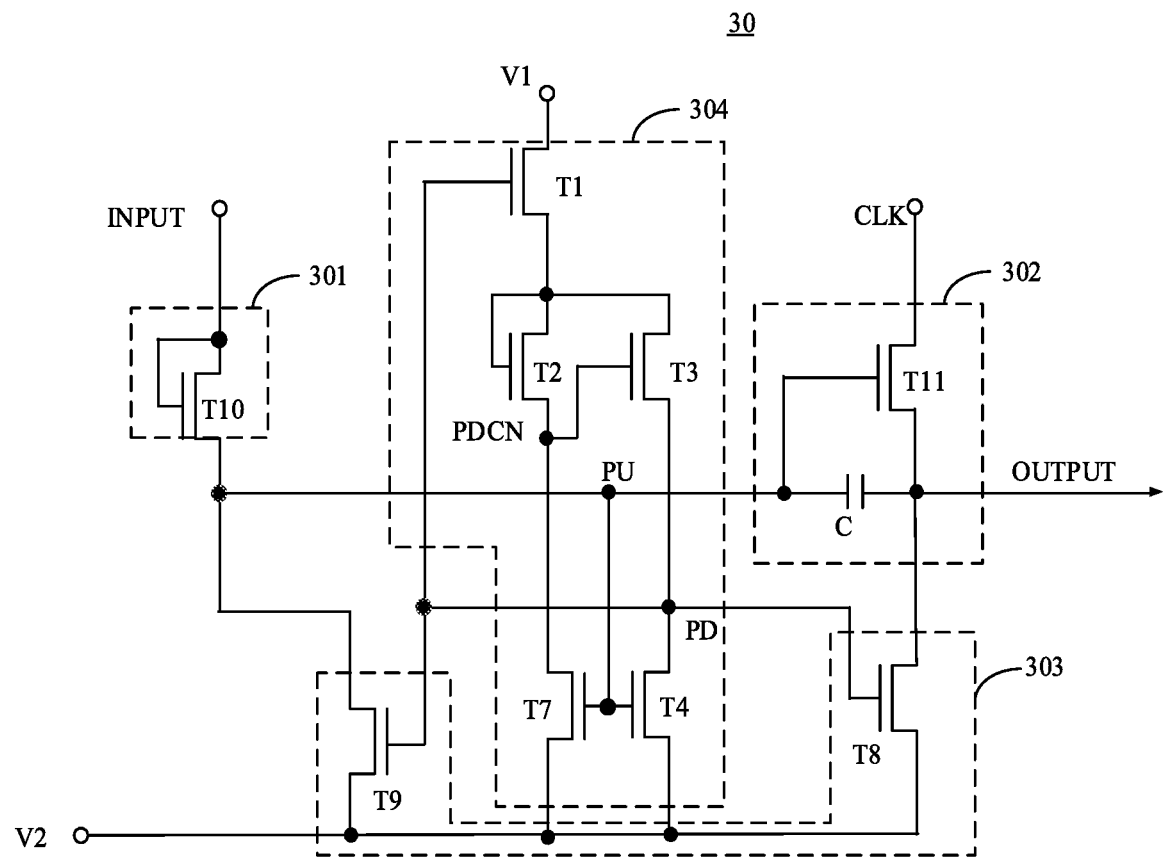
FIG. 3B illustrates an exemplary circuit diagram of a shift register unit according to an embodiment of the present disclosure.

FIG. 3B illustrates an exemplary circuit diagram of a shift register unit according to an embodiment of the present disclosure. For example, the shift register unit 30 in FIG. 3A may be implemented as the circuit structure shown in FIG. 3B.

As shown in FIG. 3B, in the shift register unit 30 according to the embodiment of the present disclosure, the pull-down node control circuit 304 may comprise a first transistor T1, a second transistor T2, and a third transistor T3. The first transistor T1 has a gate coupled to the pull-down node PD, a first electrode coupled to the first voltage terminal V1, and a second electrode coupled to a first electrode and a gate of the second transistor T2. The second transistor T2 has a second electrode coupled to a gate of the third transistor T3. The third transistor T3 has a first electrode coupled to the second electrode of the first transistor T1, and a second electrode coupled to the pull-down node PD. With the circuit structure of the pull-down node control circuit 304, the pull-down node PD may be electrically coupled to the first voltage terminal V1 under control of a potential at the pull-down node PD. It may be understood by those skilled in the art that as long as the pull-down node PD may be electrically coupled to the first voltage terminal under control of the potential at the pull-down node PD, the present disclosure is not limited to the above circuit structure shown in FIG. 3B.

As shown in FIG. 3B, the pull-down node control circuit 304 may further comprise a fourth transistor T4. The fourth transistor T4 has a gate coupled to the pull-up node PU, a first electrode coupled to the second voltage terminal V2, and a second electrode coupled to the gate of the first transistor T1. With the circuit structure of the pull-down node control circuit 304, the electrical coupling between the first voltage terminal V1 and the second voltage terminal V2 may be turned off under control of a potential at the pull-up node PU. It may be understood by those skilled in the art that as long as the electrical coupling between the first voltage terminal V1 and the second voltage terminal V2 may be turned off under control of the potential at the pull-up node PU, the present disclosure is not limited to the above circuit structure shown in FIG. 3B.

As shown in FIG. 3B, the pull-down node control circuit 304 may further comprise a seventh transistor T7 having a gate coupled to the pull-up node PU, a first electrode coupled to the second voltage terminal V2, and a second electrode coupled to the gate of the third transistor T3. With the circuit structure of the pull-down node control circuit 304, the electrical coupling between the first voltage terminal V1 and the second voltage terminal V2 may be further turned off under control of the potential at the pull-up node PU as required. It may be understood by those skilled in the art that as long as the electrical coupling between the first voltage terminal V1 and the second voltage terminal V2 may be turned off under control of the potential at the pull-up node PU, the present disclosure is not limited to the above circuit structure shown in FIG. 3B.

As shown in FIG. 3B, the resetting and de-noising circuit 303 may comprise an eighth transistor T8 and a ninth transistor T9. The eighth transistor T8 has a gate coupled to the pull-down node PD, a first electrode coupled to the second voltage terminal V2, and a second electrode coupled to the output signal terminal OUTPUT. The ninth transistor T9 has a gate coupled to the pull-down node PD, a first electrode coupled to the second voltage terminal V2, and a second electrode coupled to the pull-up node PU. With the circuit structure of the resetting and de-noising circuit 303, the pull-up node PU and the output signal terminal OUTPUT may be reset and de-noised under control of the potential at the pull-down node PD. It may be understood by those skilled in the art that as long as the pull-up node PU and the output signal terminal OUTPUT may be reset and de-noised by using, for example, a low level voltage provided at the second voltage terminal V2 under control of the potential at the pull-down node PD, the resetting and de-noising circuit according to the present disclosure is not limited to the above circuit structure shown in FIG. 3B.

In addition, according to the embodiment of the present disclosure, the input circuit 301 may comprise a tenth transistor T10. The tenth transistor T10 has a gate and a first electrode coupled to the input signal terminal INPUT, and a second electrode coupled to the pull-up node PU. With the circuit structure of the input circuit 301, an input signal from the input signal terminal INPUT may be output to the pull-up node PU. It may be understood by those skilled in the art that as long as the input signal from the input signal terminal INPUT may be output to the pull-up node PU, the input circuit is not limited to the above circuit structure shown in FIG. 3B.

In addition, according to the embodiment of the present disclosure, the output circuit 302 may comprise an eleventh transistor T11 and a capacitor C. A gate of the eleventh transistor T11 and a first terminal of the capacitor C are coupled to the pull-up node PU, a first electrode of the eleventh transistor T11 is coupled to the clock signal terminal CLK, and a second electrode of the eleventh transistor T11 and a second terminal of the capacitor C are coupled to the output signal terminal OUTPUT. With the circuit structure of the output circuit 302, the clock signal from the clock signal terminal CLK may be output to the output signal terminal OUTPUT under control of the potential at the pull-up node PU. It may be understood by those skilled in the art that as long as the clock signal from the clock signal terminal CLK may be output to the output signal terminal OUTPUT under control of the potential at the pull-up node PU, the output circuit 302 is not limited to the above circuit structure shown in FIG. 3B.

Figure 4A:
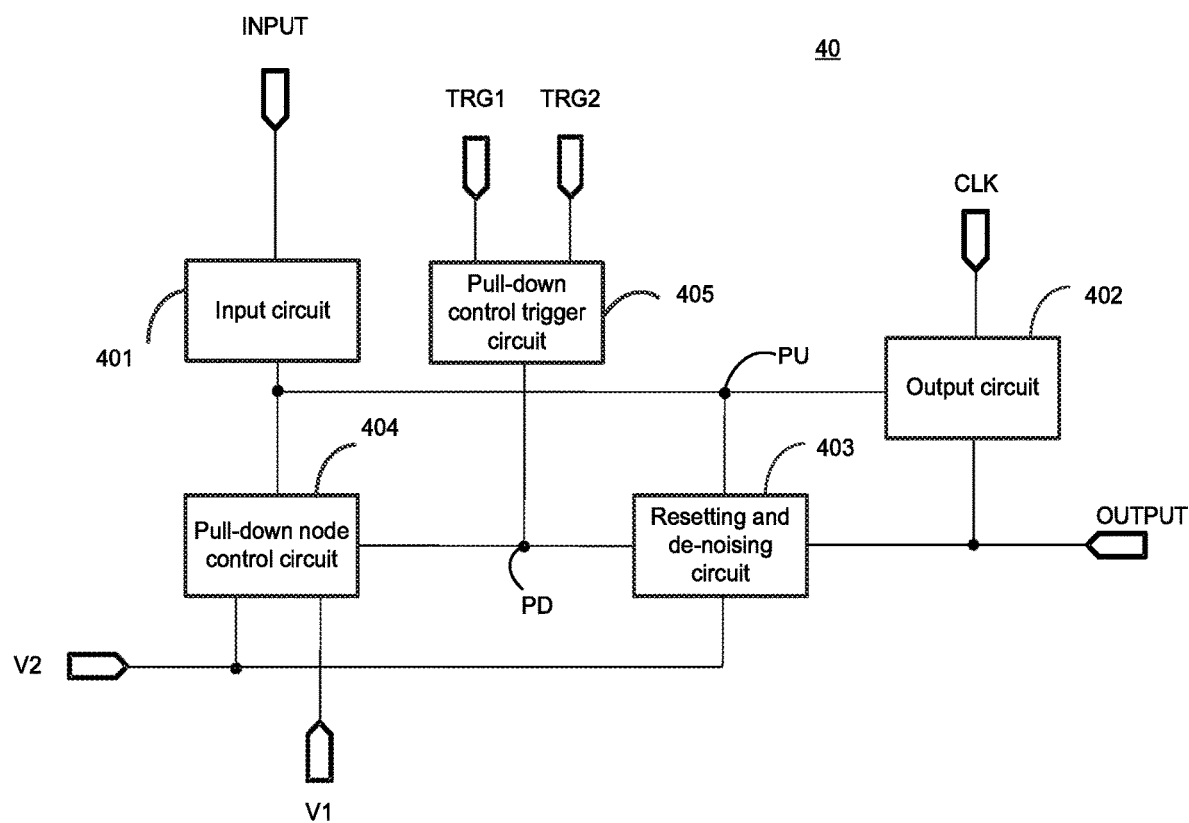
FIG. 4A illustrates another schematic block diagram of a shift register unit according to an embodiment of the present disclosure.

FIG. 4A illustrates another schematic block diagram of a shift register unit according to an embodiment of the present disclosure. As shown in FIG. 4A, the shift register unit 40 in FIG. 4A is different from the shift register unit 30 shown in FIG. 3A at least in that the shift register unit 40 in FIG. 4A further comprises a pull-down control trigger circuit 405. For the sake of brevity, the differences will be mainly described in detail below.

As shown in FIG. 4A, the shift register unit 40 comprises an input circuit 401, an output circuit 402, a resetting and de-noising circuit 403, a pull-down node control circuit 404, and a pull-down control trigger circuit 405. According to the embodiment of the present disclosure, the input circuit 401, the output circuit 402, the resetting and de-noising circuit 403, and the pull-down node control circuit 404 in FIG. 4A have functions similar to those of the input circuit 301, the output circuit 302, the resetting and de-noising circuit 303 and the pull-down node control circuit 304 as shown in FIG. 3A respectively, and will not be described here in detail again.

The pull-down control trigger circuit 405 may be coupled to a first trigger signal terminal TRG1 and the pull-down node PD (thus coupled to the pull-down node control circuit 404 through the pull-down node PD). The pull-down control trigger circuit 405 may be configured to provide a first trigger signal Trg1 from the first trigger signal terminal TRG1 to the pull-down node PD under control of the first trigger signal Trg1, so that the pull-down node control circuit 404 may perform the above control according to the potential at the pull-down node PD.

As shown in FIG. 4A, the pull-down control trigger circuit 405 may further be coupled to a second trigger signal terminal TRG2. The pull-down control trigger circuit 405 may further be configured to provide a second trigger signal Trg2 from the second trigger signal terminal TRG2 to the pull-down node PD under control of the second trigger signal Trg2, so that the pull-down node control circuit 404 may perform the above control according to the potential at the pull-down node PD.

According to the embodiment of the present disclosure, the first trigger signal at the first trigger signal terminal TRG1 may be used to perform triggering in a reset period of the shift register unit 40, to set the potential at the pull-down node PD to a high level. The second trigger signal at the second trigger signal terminal TRG2 may be used to perform initial triggering when the gate driving circuit comprising the shift register unit 40 starts to output a scanning signal for each frame, to set a potential at a pull-down node PD of each of shift register units included in the gate driving circuit to a high level. It may be understood by those skilled in the art that in a gate driving circuit comprising N stages of cascaded shift register units, an output signal of an $(n+1)^{th}$ stage of shift register may be used as a first trigger signal of an $n^{th}$ stage of shift register unit, where N is an integer greater than or equal to 2, and n is an integer greater than or equal to 1 and less than (N−1). For example, the above reset signal may be used as the first trigger signal. This may further simplify the circuit structure of the shift register unit. In addition, the second trigger signal may be a StarT Vertical (STV) signal, or may also be another frame reset signal, and the present disclosure is not limited thereto.

Figure 4B:
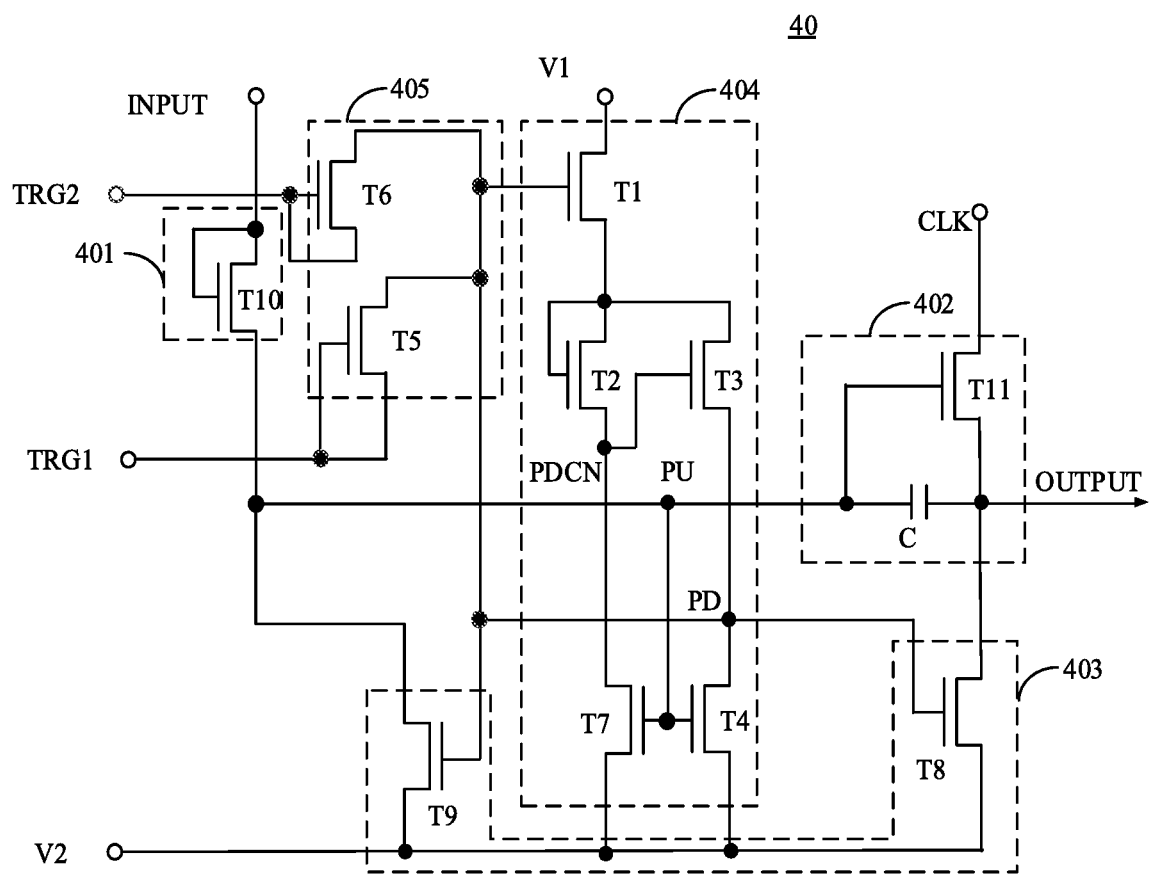
FIG. 4B illustrates another exemplary circuit diagram of a shift register unit according to an embodiment of the present disclosure.

FIG. 4B illustrates another exemplary circuit diagram of a shift register unit according to an embodiment of the present disclosure. For example, the shift register unit 40 in FIG. 4A may be implemented as the circuit structure shown in FIG. 4B.

Compared with the exemplary circuit diagram shown in FIG. 3B, as shown in FIG. 4B, the pull-down control trigger circuit 405 may comprise a fifth transistor T5. The fifth transistor T5 has a gate and a first electrode coupled to the first trigger signal terminal TRG1, and a second electrode coupled to the gate of the first transistor T1. With the circuit structure of the pull-down control trigger circuit 405, the pull-down control trigger circuit 405 may set the potential at the pull-down node PD to a high level under control of the first trigger signal at the first trigger signal terminal TRG1, so as to trigger an operation of the pull-down node control circuit 404. It may be understood by those skilled in the art that as long as the operation of the pull-down node control circuit 404 may be triggered under control of the first trigger signal, the pull-down control trigger circuit 405 is not limited to the above circuit structure shown in FIG. 4B.

In addition, as shown in FIG. 4B, the pull-down control trigger circuit 405 may further comprise a sixth transistor T6. The sixth transistor T6 has a gate and a first electrode coupled to the second trigger signal terminal TRG2, and a second electrode coupled to the gate of the first transistor T1. With the circuit structure of the pull-down control trigger circuit 405, the pull-down control trigger circuit 405 may set the potential at the pull-down node PD to a high level under control of the second trigger signal at the second trigger signal terminal TRG2, so as to trigger the operation of the pull-down node control circuit 404. It may be understood by those skilled in the art that as long as the operation of the pull-down node control circuit 404 may be triggered under control of the second trigger signal, the pull-down control trigger circuit 405 is not limited to the above circuit structure shown in FIG. 4B.

Figure 4C:
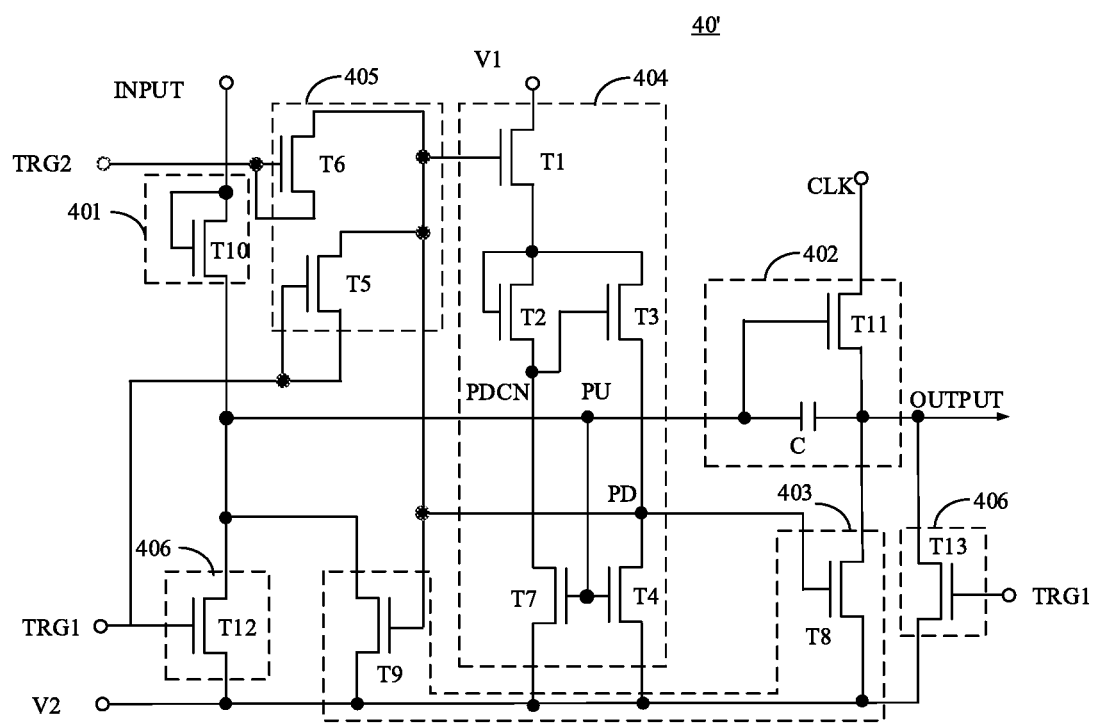
FIG. 4C illustrates still another exemplary circuit diagram of a shift register unit according to an embodiment of the present disclosure.

FIG. 4C illustrates still another exemplary circuit diagram of a shift register unit according to an embodiment of the present disclosure. The shift register unit 40' in FIG. 4C is different from the shift register unit 40 shown in FIG. 4B at least in that the shift register unit 40' in FIG. 4C further comprises a reset circuit 406. For the sake of brevity, the differences will be mainly described in detail below.

As shown in FIG. 4C, the reset circuit 406 is coupled to the first trigger signal terminal TRG1, the pull-up node PU, and the second voltage terminal V2. In FIG. 4C, the first trigger signal terminal TRG1 may be multiplexed as a reset signal terminal which provides a reset signal, and the first trigger signal may be the reset signal. The reset circuit 406 may reset the pull-up node PU under control of the first trigger signal (i.e., the reset signal) at the first trigger signal terminal TRG1 to, for example, a low level at the second voltage terminal V2. In some embodiments, the reset circuit 406 may further reset the output signal terminal OUTPUT under control of the first trigger signal (i.e., the reset signal) at the first trigger signal terminal TRG1.

In FIG. 4C, the reset circuit 406 comprises a twelfth transistor T12 and a thirteenth transistor T13. The twelfth transistor T12 has a gate coupled to the first trigger signal terminal TRG1, a first electrode coupled to the second voltage terminal V2, and a second electrode coupled to the pull-up node PU. The thirteenth transistor T13 has a gate coupled to the first trigger signal terminal TRG1, a first electrode coupled to the second voltage terminal V2, and a second electrode coupled to the output signal terminal OUTPUT.

By using the reset signal as the first trigger signal and using the reset circuit 406, the pull-down node PD may become a high level in time when the shift register unit is reset.

Figure 5:
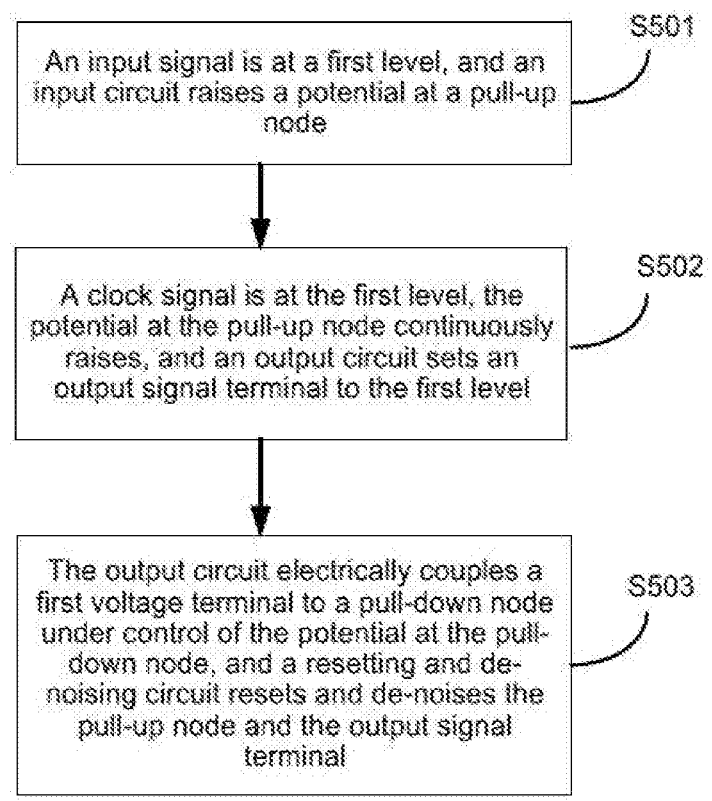
FIG. 5 illustrates a flowchart of a method of driving a shift register unit according to an embodiment of the present disclosure.

According to another aspect of the embodiments of the present disclosure, there is provided a method of driving a shift register unit, which may be applied to the shift register unit according to the embodiments of the present disclosure. It should be illustrated that a sequence number of the respective steps in the following method is only used as a representation of the steps for description, and should not be regarded as indicating an execution order of the respective steps. Unless explicitly stated, the method needs not be performed exactly in the order shown. FIG. 5 illustrates a flowchart of a method of driving a shift register unit according to an embodiment of the present disclosure. As shown in FIG. 5, the method 50 of driving a shift register unit according to the embodiment of the present disclosure may comprise the following steps.

In step S501, an input signal is at a first level, and an input circuit raises a potential at a pull-up node.

In step S502, a clock signal is at the first level, the potential at the pull-up node continuously raises, and an output circuit sets an output signal terminal to the first level.

In step S503, the output circuit electrically couples a first voltage terminal to a pull-down node under control of the potential at the pull-down node, and a resetting and de-noising circuit resets and de-noises the pull-up node and the output signal terminal. For example, in response to the high potential at the pull-down node, the resetting and de-noising circuit may pull down both the pull-up node and the output signal terminal to a second level.

In a case where the pull-down node control circuit is further coupled to the pull-up node and a second voltage terminal, the method according to the embodiment of the present disclosure further comprises: in the step S501 and the step S502, the pull-down node control circuit electrically decouples the first voltage terminal from the second voltage terminal under control of the potential at the pull-up node.

In a case where the shift register unit further comprises a pull-down control trigger circuit, the method according to the embodiment of the present disclosure further comprises: in the step S503, a first trigger signal is at the first level, and the pull-down control trigger circuit triggers the pull-down node control circuit to control the potential at the pull-down node under control of the first trigger signal.

In a case where the shift register unit further comprises the pull-down control trigger circuit, the method according to the embodiment of the present disclosure further comprises: in a fourth period after the step S503, the resetting and de-noising circuit continuously de-noises the pull-up node and the output signal terminal under control of the potential at the pull-down node PD.

Figure 6:
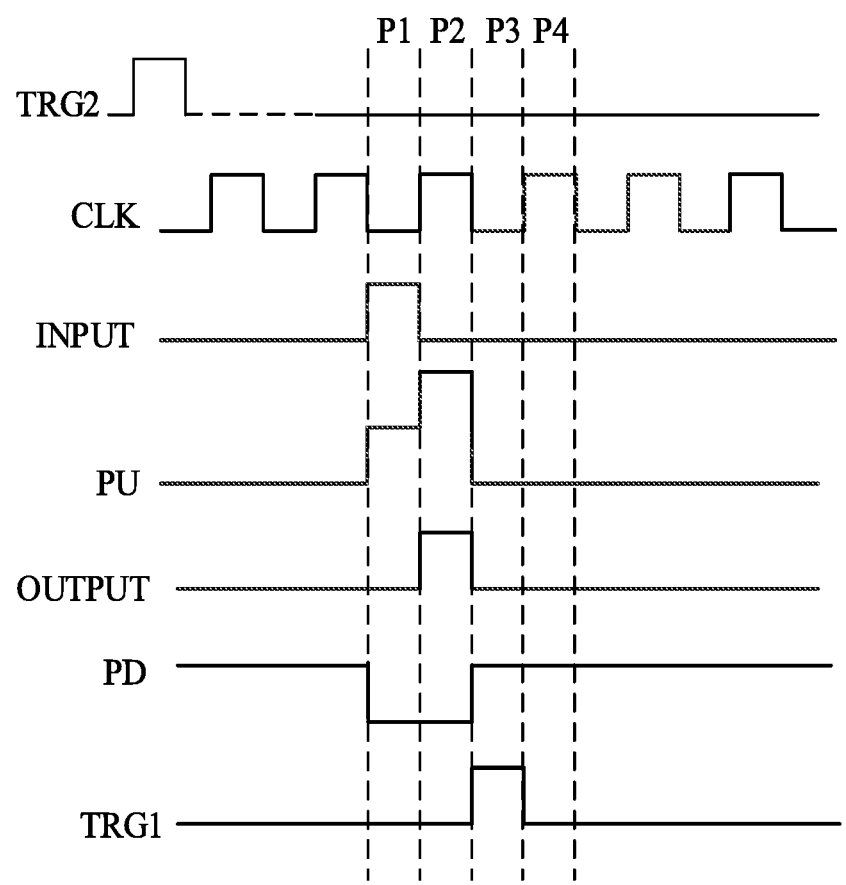
FIG. 6 illustrates an operation timing diagram of a shift register unit according to an embodiment of the present disclosure.

FIG. 6 illustrates an operation timing diagram of a shift register unit according to an embodiment of the present disclosure. Next, an operation of the shift register unit according to the embodiment of the present disclosure will be described in detail with reference to FIGS. 3B, 4B, 4C, 5 and 6. For convenience of description, in the following examples, description is made by taking the first level being a high level and the second level being a low level as an example. In addition, in the following examples, description is made by taking all switch transistors being N-type transistors as an example.

As shown in FIG. 6, in a first period P1, an input signal at the input signal terminal INPUT is at a high level, the tenth transistor T10 is turned on, and a voltage at the pull-up node PU starts to raise to charge the capacitor C. Since the pull-up node PU is at a high level, the fourth transistor T4 and the seventh transistor T7 are turned on, and a second voltage signal V2 at a low level is transmitted to the node PDCN and the pull-down node PD through the fourth transistor T4 and the seventh transistor T7 respectively. At the same time, since the pull-up node PU is at a high level, the eleventh transistor T11 is turned on, and a clock signal at the clock signal terminal CLK is transmitted to the output signal terminal OUTPUT. Since the clock signal at the clock signal terminal CLK is at a low level at this time, an output signal at the output signal terminal OUTPUT is also at a low level.

In a second period P2, the clock signal at the clock signal terminal CLK is at a high level, and the fourth transistor T4 and the seventh transistor T7 are continuously turned on under action of the pull-up node PU, to transmit the clock signal to the output signal terminal OUTPUT. At this time, the output signal at the output signal terminal OUTPUT is at a high level, and is output as a signal of the shift register. Due to the bootstrapping effect of the capacitor C, the potential at the pull-up node PU is bootstrapped to a higher potential.

In a third period P3, in a case of the structure of FIG. 4B, a first trigger signal at the first trigger signal terminal TRG1 is at a high level. The fifth transistor T5 is turned on. Substantially the fifth transistor T5 of which the gate and the source are intercoupled functions as a diode. When the fifth transistor T5 is turned on, the pull-down node PD is at a high level. The first transistor T1 is turned on, and a direct current high voltage provided at the first voltage terminal V1 pulls up a potential at the node PDCN through the second transistor T2. The node PDCN is at a high level, and thereby the third transistor T3 is turned on, to form a positive feedback in which the first transistor T1 is turned on to pull up the potential at the pull-down node PD which causes the first transistor T1 to continuously be turned on, thus electrically coupling the first voltage terminal V1 to the pull-down node PD. In addition, the pull-down node PD is at a high level, the eighth transistor T8 and the ninth transistor T9 are turned on, and the second voltage signal at a low level at the second voltage terminal V2 is transmitted to the output signal terminal OUTPUT and the pull-up node PU through the eighth transistor T8 and the ninth transistor T9 respectively, so that the output signal terminal OUTPUT and the pull-up node PU are at a low level, thereby substantially realizing pull-down of the output signal terminal OUTPUT and the pull-up node PU, to achieve resetting and de-noising of the output signal terminal OUTPUT and the pull-up node PU. In the structure shown in FIG. 4C, the high level at the first trigger signal terminal TRG1 also causes the twelfth transistor T12 to be turned on, thereby resetting the pull-up node PU to the low level at the second voltage terminal V2.

In a fourth period P4, the first trigger signal at the first trigger signal terminal TRG1 is at a low level. Since the pull-up node PU is at a low level, the fourth transistor T4 and the seventh transistor T7 are turned off. The potential at the pull-down node PD is at a high level, and the first transistor T1, the second transistor T2, and the third transistor T3 are turned on, so that a direct current high level voltage from the first voltage terminal V1 may be continuously written into the pull-down node PD. Thereby, the pull-down node PD is maintained at a high level using the positive feedback in the fourth period P4, until the next time a high level signal is input at the input signal terminal to set the pull-up node PU to a high level.

According to the embodiment of the present disclosure, in the third period P3, since the potential at the pull-down node PD is pulled up using the first trigger signal at the first trigger signal terminal TRG1, and the potential at the pull-down node PD is at a high level at this time, the potentials at the output signal terminal OUTPUT and the pull-up node PU become a low level through the eighth transistor T8 and the ninth transistor T9 respectively, thereby realizing the resetting of the output signal terminal OUTPUT and the pull-up node PU. At the same time, in the fourth period P4, the potential at the pull-down node PD is maintained at a high level, and the potentials at the output signal terminal OUTPUT and the pull-up node PU are also maintained at a low level through the eighth transistor T8 and the ninth transistor T9, thereby achieving the de-noising of the output signal terminal OUTPUT and the pull-up node PU. Therefore, according to the embodiment of the present disclosure, the same circuit structure may be used to simultaneously implement the resetting and de-noising functions of the pull-up node and the output signal terminal, and there is no need to provide a dedicated reset circuit to reset the pull-up node and the output signal terminal, thereby further simplifying the circuit structure. Of course, it may be understood by those skilled in the art that a dedicated reset circuit may also be provided to independently reset the output signal terminal OUTPUT and the pull-up node PU using, for example, the structure shown in FIG. 4C, which will not be described here in detail again for the sake of brevity.

According to the embodiment of the present disclosure, in the first period P1 and the second period P2, the pull-down node PD is at a low level, the first transistor T1 is turned off, and then the second transistor T2 and the third transistor T3 are turned off, thereby electrically decoupling the first voltage terminal V1 from the second voltage terminal V2.

In addition, according to the embodiment of the present disclosure, when the gate driving circuit comprising the shift register unit starts to output a scanning signal for each frame, a second trigger signal at the second trigger signal terminal TRG2 is at a high level, and the sixth transistor T6 is turned on. Substantially the sixth transistor T6 of which the gate and the source are coupled to each other functions as a diode. In response to the second trigger signal at the second trigger signal terminal TRG2, the potential at the pull-down node PD is pulled up, thereby triggering a pull-down node control circuit in each of the cascaded shift register units to start to operate, to reset and de-noise a pull-up node and an output signal terminal OUTPUT in the shift register unit. Thereby, a pull-down node PD in each of the shift register circuits may be triggered before a first stage of shift register unit starts to operate, to ensure that a resetting and de-noising circuit in each of the shift register units starts to operate normally.

According to an embodiment of the present disclosure, there is further provided a gate driving circuit comprising N stages of cascaded shift register units according to the embodiment of the present disclosure. According to the embodiment of the present disclosure, a clock signal terminal of an $n^{th}$ stage of shift register unit is coupled to a clock signal line, an output signal terminal of the $n^{th}$ stage of shift register unit is coupled to an input signal terminal of an $(n+1)^{th}$ stage of shift register unit, and a first trigger signal terminal of the $n^{th}$ stage of shift register unit is coupled to an output signal terminal of the $(n+1)^{th}$ stage of shift register unit, where N is an integer greater than or equal to 2, and n is an integer greater than or equal to 1 and less than (N−1). In addition, an input signal terminal of a first stage of shift register unit and a first trigger signal terminal of an $N^{th}$ stage of shift register unit may be coupled to receive an STV signal or another frame reset signal. In addition, each of the N stages of shift register units has a second trigger signal terminal coupled to receive a frame reset signal. Similarly, the "frame reset signal" may be an STV signal or another frame reset signal, and the present disclosure is not limited thereto.

Figure 7:
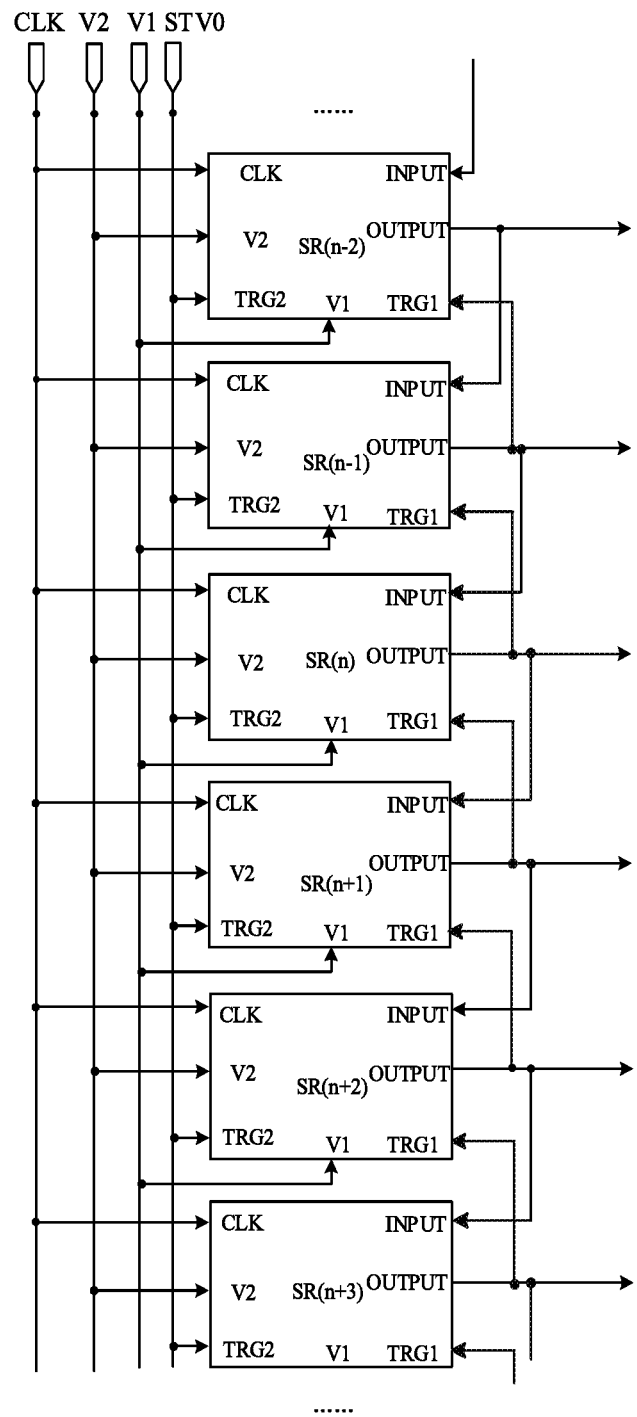
FIG. 7 illustrates an exemplary manner in which shift register units in a gate driving circuit are cascaded according to an embodiment of the present disclosure.

FIG. 7 illustrates an exemplary gate driving circuit according to an embodiment of the present disclosure. In the example in FIG. 7, by taking an $n^{th}$ stage of shift register unit SR(n) as an example, an output signal terminal OUTPUT of the $n^{th}$ stage of shift register unit SR(n) is coupled to an input signal terminal INPUT of an $(n+1)^{th}$ stage of shift register unit SR(n+1) and a first trigger signal terminal TRG1 of an $(n−1)^{th}$ stage of shift register unit SR(n−1).

In the example of FIG. 7, second trigger signal terminals TRG2 of the N stages of shift register units SR(n) are further coupled to receive a STV signal STV0. Before the start of display for each frame, the STV signal STV0 may be set to an effective level (for example, a high level) for a period of time.

For the sake of brevity, only one clock signal is used in the example of FIG. 7. It may be understood by those skilled in the art that the embodiment of the present disclosure may of course be applied to a case where there are a plurality of clocks.

In addition, it may be understood by those skilled in the art that the terms "$(n−1)^{th}$ stage of shift register unit" and "$n^{th}$ stage of shift register unit" represent "an output signal terminal of the $(n−1)^{th}$ stage of shift register unit is coupled to an input signal terminal of the $n^{th}$ stage of shift register unit", and should not be construed as two shift register units which are physically adjacent to each other.

In addition, the output signal terminal of the $(n−1)^{th}$ stage of shift register unit is coupled to the input signal terminal of the $n^{th}$ stage of shift register unit. When the $(n−1)^{th}$ stage of shift register unit does not exist, for example, the $n^{th}$ stage of shift register unit is a first stage of shift register unit, the signal input terminal of the $n^{th}$ stage of shift register unit may be coupled to receive, for example, an STV, and an output signal terminal of an $(n+1)^{th}$ stage of shift register unit is coupled to a first trigger signal terminal of the $n^{th}$ stage of shift register unit. When the $(n+1)^{th}$ stage of shift register unit does not exist, for example, the $n^{th}$ stage of shift register unit is an $N^{th}$ stage of shift register unit, the first trigger signal terminal of the $n^{th}$ stage of shift register unit may be coupled to receive, for example, a frame reset signal.

Figure 8:
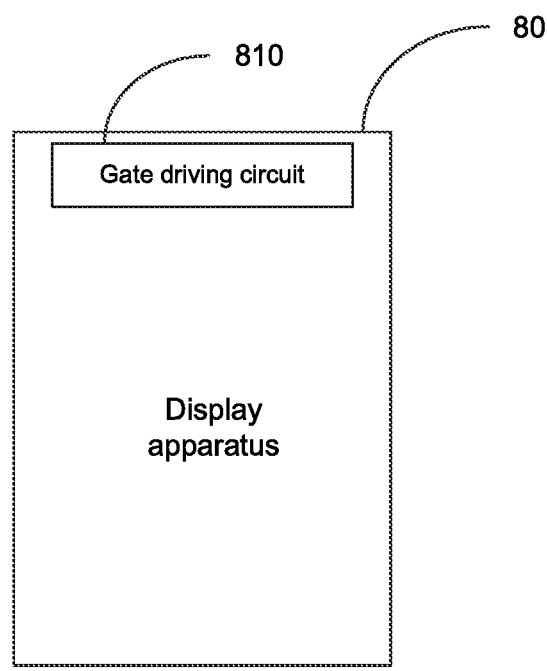
FIG. 8 illustrates a schematic block diagram of a display apparatus according to an embodiment of the present disclosure.

FIG. 8 illustrates a schematic block diagram of a display apparatus according to an embodiment of the present disclosure. As shown in FIG. 8, the display apparatus 80 may comprise a gate driving circuit 810 according to an embodiment of the present disclosure. The display apparatus 80 according to the embodiment of the present disclosure may be any product or component having a display function, such as an electronic paper, a mobile phone, a tablet computer, a television, a display, a notebook computer, a digital photo frame, a navigator etc.

The specific embodiments described above further describe the purposes, technical solutions, and beneficial effects of the embodiments of the present disclosure in detail. It should be understood that the above description is only specific embodiments of the embodiments of the present disclosure, and is not used for limiting the present disclosure. Any modifications, equivalent substitutions, improvements, etc. made within the spirit and principles of the present disclosure shall be included in the protection scope of the present disclosure.

We claim:

1. A shift register unit, comprising:
   an input circuit coupled to an input signal terminal and a pull-up node, and configured to output an input signal from the input signal terminal to the pull-up node;
   an output circuit coupled to a clock signal terminal, an output signal terminal and the pull-up node, and configured to output a clock signal from the clock signal terminal to the output signal terminal under control of a potential at the pull-up node;
   a resetting and de-noising circuit coupled to the pull-up node, a pull-down node and the output signal terminal, and configured to reset and de-noise the pull-up node and the output signal terminal under control of a potential at the pull-down node; and
   a pull-down node control circuit coupled to a first voltage terminal and the pull-down node, and configured to electrically couple the pull-down node to the first voltage terminal under control of the potential at the pull-down node,
   wherein the pull-down node control circuit is further coupled to the pull-up node and a second voltage terminal, and is further configured to control electrical coupling between the first voltage terminal and the second voltage terminal under control of the potential at the pull-up node;
   wherein the pull-down node control circuit comprises a first transistor, a second transistor and a third transistor, wherein
      the first transistor has a gate coupled to the pull-down node, a first electrode coupled to the first voltage terminal, and a second electrode coupled to a first electrode and a gate of the second transistor;
      the second transistor has a second electrode coupled to a gate of the third transistor; and
      the third transistor has a first electrode coupled to the second electrode of the first transistor, and a second electrode coupled to the pull-down node.

2. The shift register unit according to claim 1, wherein the pull-down node control circuit further comprises a fourth transistor, wherein
   the fourth transistor has a gate coupled to the pull-up node, a first electrode coupled to the second voltage terminal, and a second electrode coupled to the gate of the first transistor.

3. The shift register unit according to claim 1, further comprising a pull-down control trigger circuit coupled to a first trigger signal terminal and the pull-down node, and configured to provide a first trigger signal from the first trigger signal terminal to the pull-down node under control of the first trigger signal.

4. The shift register unit according to claim 3, wherein the pull-down control trigger circuit comprises a fifth transistor having a gate and a first electrode coupled to the first trigger signal terminal, and a second electrode coupled to the pull-down node.

5. The shift register unit according to claim 3, wherein the pull-down control trigger circuit is further coupled to a second trigger signal terminal, and is further configured to trigger the pull-down node control circuit to control the potential at the pull-down node under control of a second trigger signal from the second trigger signal terminal.

6. The shift register unit according to claim 5, wherein the pull-down control trigger circuit further comprises a sixth transistor having a gate and a first electrode coupled to the second trigger signal terminal, and a second electrode coupled to the pull-down node.

7. The shift register unit according to claim 2, wherein the pull-down node control circuit further comprises a seventh transistor having a gate coupled to the pull-up node, a first electrode coupled to the second voltage terminal, and a second electrode coupled to the gate of the third transistor.

8. The shift register unit according to claim 1, wherein the resetting and de-noising circuit comprises an eighth transistor and a ninth transistor, wherein
   the eighth transistor has a gate coupled to the pull-down node, a first electrode coupled to the second voltage terminal, and a second electrode coupled to the output signal terminal; and
   the ninth transistor has a gate coupled to the pull-down node, a first electrode coupled to the second voltage terminal, and a second electrode coupled to the pull-up node.

9. The shift register unit according to claim 1, wherein the input circuit comprises a tenth transistor having a gate and a first electrode coupled to the input signal terminal, and a second electrode coupled to the pull-up node.

10. The shift register unit according to claim 1, wherein the output circuit comprises an eleventh transistor and a capacitor, wherein
    a gate of the eleventh transistor and a first terminal of the capacitor are coupled to the pull-up node, a first electrode of the eleventh transistor is coupled to the clock signal terminal, and a second electrode of the eleventh transistor and a second terminal of the capacitor are coupled to the output signal terminal.

11. The shift register unit according to claim 3, further comprising: a reset circuit coupled to the first trigger signal terminal, the pull-up node, the output signal terminal, and a second voltage terminal, and configured to reset the pull-up node and the output signal terminal to a potential at the second voltage terminal under control of the first trigger signal at the first trigger signal terminal.

12. The shift register unit according to claim 11, wherein the reset circuit comprises a twelfth transistor and a thirteenth transistor, wherein
    the twelfth transistor has a gate coupled to the first trigger signal terminal, a first electrode coupled to the second voltage terminal, and a second electrode coupled to the pull-up node; and
    the thirteenth transistor has a gate coupled to the first trigger signal terminal, a first electrode coupled to the second voltage terminal, and a second electrode coupled to the output signal terminal.

13. A gate driving circuit, comprising:

N stages of cascaded shift register units according to claim 1, wherein
an output signal terminal of an $n^{th}$ stage of shift register unit is coupled to an input signal terminal of an $(n+1)^{th}$ stage of shift register unit, and a first trigger signal terminal of the $n^{th}$ stage of shift register unit is coupled to an output signal terminal of the $(n+1)^{th}$ stage of shift register unit, where N is an integer greater than or equal to 2, and n is an integer greater than or equal to 1 and less than (N−1).

14. The gate driving circuit according to claim 13, wherein each of the N stages of cascaded shift register units has a second trigger signal terminal coupled to receive a frame reset signal.

15. A method of driving the shift register unit according to claim 1, comprising:
in a first period in which an input signal is at a first level, raising, by the input circuit, a potential at the pull-up node;
in a second period in which a clock signal is at the first level, continuously raising the potential at the pull-up node, and causing, by the output circuit, the output signal terminal to be at the first level; and
in a third period, electrically coupling, by the pull-down node control circuit, the first voltage terminal to the pull-down node under control of a potential at the pull-down node, and resetting and de-noising, by the resetting and de-noising circuit, the pull-up node and the output signal terminal.

16. The method according to claim 15, wherein the pull-down node control circuit is further coupled to the pull-up node and a second voltage terminal, and in the first period and the second period, the pull-down node control circuit electrically decouples the first voltage terminal from the second voltage terminal under control of the potential at the pull-up node.

17. The method according to claim 15, wherein the shift register unit further comprises a pull-down control trigger circuit, and the method further comprises: in the third period in which a first trigger signal is at the first level, triggering, by the pull-down control trigger circuit, the pull-down node control circuit to control the potential at the pull-down node under control of the first trigger signal.

18. The method according to claim 15, further comprising: in a fourth period, continuously de-noising, by the resetting and de-noising circuit, the pull-up node and the output signal terminal under control of the potential at the pull-down node.

* * * * *